US006762399B2

(12) United States Patent
Shimizu

(10) Patent No.: US 6,762,399 B2
(45) Date of Patent: Jul. 13, 2004

(54) SHAPE MEASUREMENT DEVICE

(75) Inventor: Fusao Shimizu, Fujisawa (JP)

(73) Assignee: Nikon Corporation, Tokyo (JP)

( * ) Notice: Subject to any disclaimer, the term of this patent is extended or adjusted under 35 U.S.C. 154(b) by 294 days.

(21) Appl. No.: 09/863,447

(22) Filed: May 24, 2001

(65) Prior Publication Data

US 2002/0017599 A1 Feb. 14, 2002

(30) Foreign Application Priority Data

May 25, 2000 (JP) ........................................ 2000-155493

(51) Int. Cl.[7] .......................... H01L 27/00; G01B 11/24
(52) U.S. Cl. ..................................... 250/208.1; 356/601
(58) Field of Search ................................. 356/601, 608; 250/559.22, 559.27

(56) References Cited

U.S. PATENT DOCUMENTS 6,166,801 A * 12/2000 Dishon et al. ................ 355/27
6,603,103 B1 * 8/2003 Ulrich et al. ............... 250/205

* cited by examiner

Primary Examiner—Zandra V. Smith
(74) Attorney, Agent, or Firm—Oliff & Berridge, PLC

(57) ABSTRACT

A shape measurement device includes: a stage for loading a subject for measurement; an imaging section that forms an image of the subject for measurement; and a shifting section that implements relative shifting between the imaging section and the subject for measurement to shift the imaging section to a position corresponding to a portion on the subject for measurement which is to be measured, and the shifting section implements the relative shifting by shifting the imaging section without shifting the stage.

6 Claims, 12 Drawing Sheets

A-A' SECTIONAL VIEW

A-A' SECTIONAL VIEW

VERTICAL ORIENTATION

HORIZONTAL ORIENTATION

B-B' SECTIONAL VIEW

B-B' SECTIONAL VIEW
(WITH PRESSURE REDUCTION FAN 48 OPERATING)

A-A' SECTIONAL VIEW
(WITH PRESSURE REDUCTION FAN 48 OPERATING)

SHAPE MEASUREMENT DEVICE

INCORPORATION BY REFERENCE

The disclosure of the following priority application is herein incorporated by reference:

Japanese Patent Application No. 2000-155493, filed May. 25, 2000.

BACKGROUND OF THE INVENTION

1. Field of the Invention

The present invention relates to a shape measurement device for an article whose shape is required to be accurate, and in particular relates to a shape measurement device intended for the measurement of a carrier which is used upon a semiconductor device production line for transporting a set of several semiconductor wafers all together.

2. Description of the Related Art

Upon a production line for semiconductor devices, in order to transport a semiconductor wafer between devices which perform film deposition, processing or the like, there has been employed a per se known method of transporting the semiconductor wafers by collecting together several at one time in a receptacle termed a "carrier". Generally, this type of carrier is formed with a number of slots being provided upon its inner walls on both its sides at predetermined intervals, and is made so as to hold a plurality of semiconductor wafers in a horizontally superimposed state with predetermined intervals between them, by supporting both the sides of the semiconductor wafers by these grooves.

When a semiconductor wafer is to be taken out from the carrier after it has been transported and is to be inserted into a device which performs a process like film deposition, processing or the like, a so called "robot arm" device inserts the end of an arm, which is formed in a thin plate shape, between two adjacent semiconductor wafers in the carrier. Then the end of the robot arm performs the operation of pulling a single semiconductor wafer out forwards towards itself along the grooves while lifting it up by its under surface.

At this time there is a danger that, if the space between one semiconductor wafer and the adjacent one supported in the carrier deviates from its design value by more than its permitted value, the end of the robot arm may touch against the upper surface of the adjacent semiconductor wafer. Since film deposition, processing or the like has been performed upon the upper surfaces of the semiconductor wafers by the previous processes up until this point, it is not desirable for the end of the robot arm to come into contact with any upper wafer surface, because damage or contamination may result. Furthermore, if the heights at which the semiconductor wafers are supported in the carrier deviate from the design values, apart from the possibility that the robot arm may touch the upper surface of some semiconductor wafer, there is a danger that one semiconductor wafer may be damaged by collision with the front edge of the semiconductor wafer. Yet further, if one of the semiconductor wafers is tilted, the end of the robot arm may not be able properly to lift up this semiconductor wafer. Due to these problems, it is extremely important for the heights at which the semiconductor wafers are supported in the carrier, the spaces between the semiconductor wafers, and the inclinations of the semiconductor wafers, all to be constrained to be within their permitted ranges around their design values.

For this reason, a shape measurement operation is performed at the time of shipping of the carrier from the carrier manufacturer and/or at the time of receipt of the carrier by the semiconductor device maker, in order to determine whether or not the shape of the carrier accords with its design values. Further, it may happen that the carrier becomes deformed during use, since cleansing processes and the like upon a semiconductor device production line are performed at high temperatures. Due to this, a measurement operation may be performed by the semiconductor device maker while the carrier is partway along the production line, in order to check whether or not its shape accords with its design values.

There is a per se known prior art carrier shape measurement device which measures the shape of a so called open carrier in which apertures are formed both in its front surface and also in its rear surface. With this structure, this open carrier is illuminated from its rear, and images are formed by a CCD camera or the like of the external shape of the carrier and the shapes of the grooves from the front, and the process of shape measurement is performed by processing these images.

However, since the grooves in the carrier are formed upon both the sides thereof, even if the shapes of these grooves are measured, it has been difficult accurately to derive from these values the spaces between the central portions of the wafers which are supported in these grooves, and their heights and inclinations. In particular, with a carrier shape measurement device according to this prior art, since the images which are used are formed from the front side of the carrier, therefore information cannot be obtained as to what the shapes of the grooves may be, further in the direction into the grooves than the depth of focus of the CCD camera. Because of this, even though the spaces between the wafers which are supported in these grooves, and their heights and inclinations, can be derived with accuracies on the order of millimeters, there have been great difficulties in increasing the accuracy above such a level.

More particularly, in recent years, the use has increased of so called large size semiconductor wafers of diameter of 300 mm or greater. Since both the edges of these large size semiconductor wafers are supported in the carrier in grooves which are several millimeters deep, it becomes more and more difficult to know, from the shapes of the grooves, the state of support with regard to the spaces between the central portions of the wafers and their inclinations and the like. Moreover since, in the case of semiconductor wafers of large diameter, if a wafer is inclined even a little, the spaces between it and the neighboring wafers become extremely restricted, therefore a measurement accuracy on the order of millimeters is no longer adequate, and a further enhancement of the accuracy of measurement is desirable.

Yet further, since such a carrier measurement device according to the prior art is directed towards measurement of an open carrier, therefore it is not capable of being applied to the measurement of the shape of a sealed type carrier which has a blocked rear side and a cover over its front side, such as a so-called FOUP (Front Opening Unified Pod) carrier for wafers of 300 mm diameter according to the SEMI standard.

SUMMARY OF THE INVENTION

The objective of the present invention is to propose a carrier shape measurement device which can measure with high accuracy the attitudes of semiconductor wafers which are loaded into the carrier.

In order to attain the above described objective, a shape measurement device according to the present invention, comprises: a stage for loading a subject for measurement; an imaging section that forms an image of the subject for measurement; and a shifting section that implements relative shifting between the imaging section and the subject for measurement to shift the imaging section to a position corresponding to a portion on the subject for measurement which is to be measured, and the shifting section implements the relative shifting by shifting the imaging section without shifting the stage.

Another shape measurement device according to the present invention, comprises: a stage for loading a subject for measurement; a measurement section that measures a shape of the subject for measurement; a shifting section that implements relative shifting between the imaging section and the subject for measurement to shift the imaging section to a position corresponding to a portion on the subject for measurement which is to be measured; and a chassis that houses at least a part of the measurement section and the shifting section. And: the chassis is formed, at a region thereof which faces the subject for measurement, with an aperture which does not hinder the shifting of the measurement section; an end of the measurement section protrudes from the aperture towards the subject for measurement; and a dustproof member is disposed at the aperture in order to prevent dust within the chassis from leaking out towards the subject for measurement while not hindering the shifting of the measurement section, the dustproof member covering the aperture except for a portion corresponding to the measurement section.

In this shape measurement device, it is preferred that a negative pressure device that decompresses an interior of the chassis in order to distort the dustproof member and create an air current which enters into the chassis through a gap between the distorted dustproof member and the aperture, is further provided.

Another shape measurement device according to the present invention, comprises: a stage for loading a subject for measurement; a measurement section that measures a shape of the subject for measurement; and a shifting section that implements relative shifting between the measurement section and the subject for measurement to shift the measurement section to a position corresponding to a portion on the subject for measurement which is to be measured. And the measurement section comprises an illumination section which illuminates laser light upon the subject for measurement from a slanting direction, a light reception section which receives the laser light which has been reflected from the subject for measurement, and a rotation drive section which rotates the illumination section and the light reception section while preserving a mutual positional relationship of the illumination section and the light reception section, without changing a region upon the subject for measurement which is illuminated by the laser light.

In this shape measurement device, it is preferred that the measurement section comprises an imaging section for forming an image of the subject for measurement, and detects a distance from the subject for measurement along a direction of an optical axis of the imaging section based upon an output from the light reception section.

DESCRIPTION OF THE PREFERRED EMBODIMENTS

An embodiment of the carrier shape measurement device according to the present invention will now be described with reference to the drawings.

Figure 1:
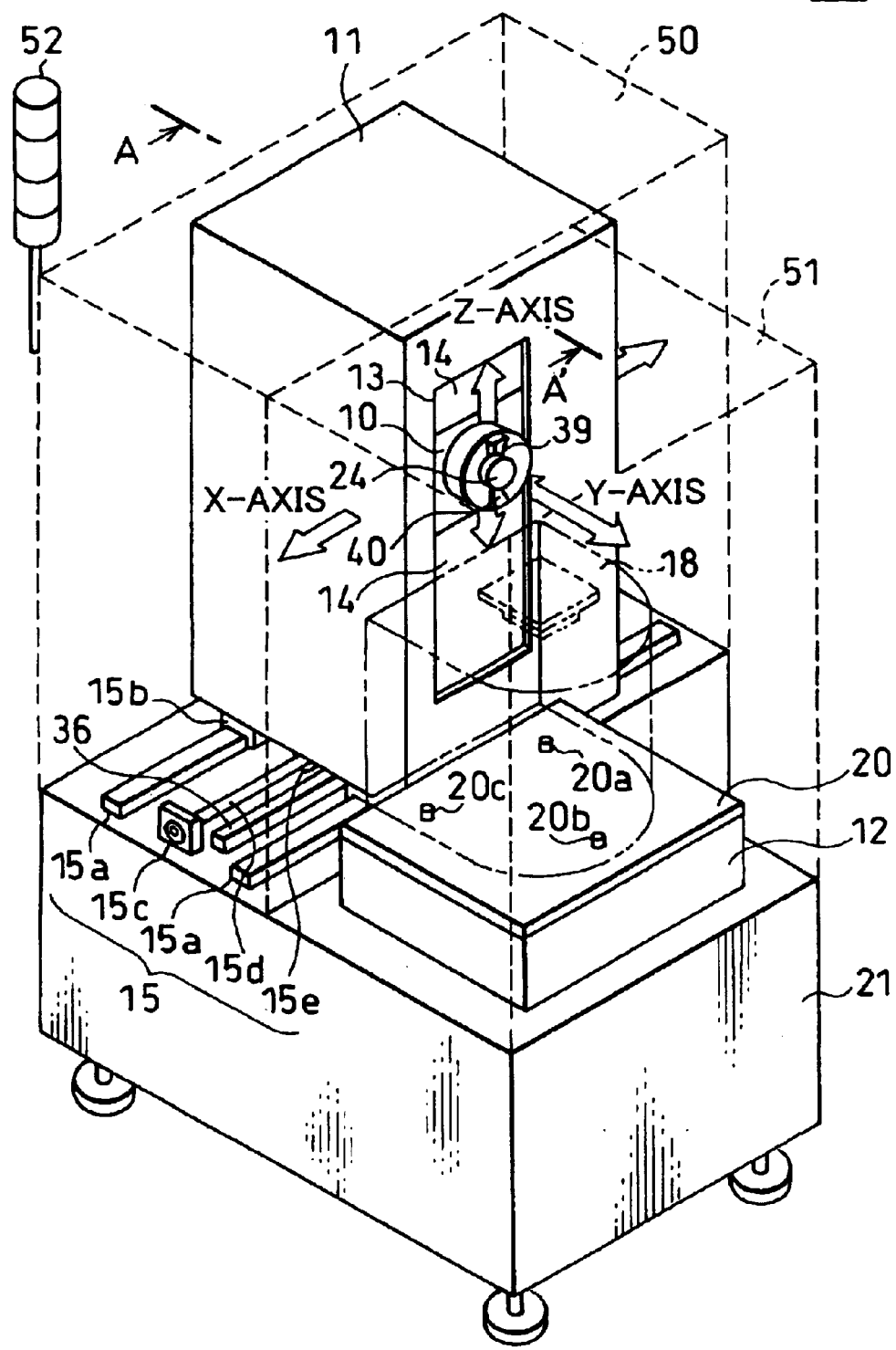
FIG. 1 shows a perspective view showing a measurement device main body 110 of the carrier shape measurement device according to the first embodiment of the present invention as seen from the outside.
Figure 2:
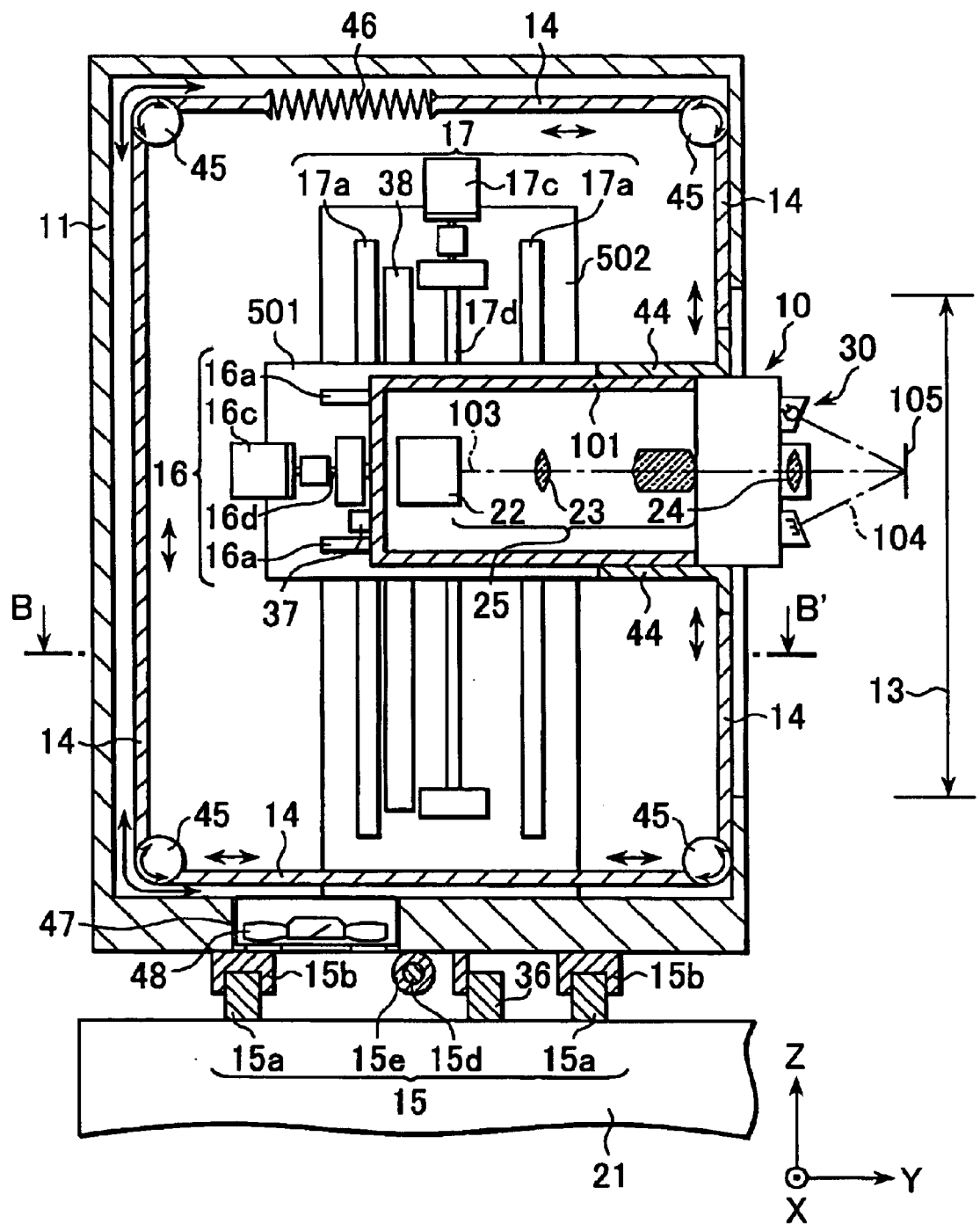
FIG. 2 shows a sectional view, taken looking along the arrows A–A' in FIG. 1, showing this carrier shape measurement device according to the first embodiment of the present invention, shown when a pressure reduction fan 48 is not operating.
Figure 3:
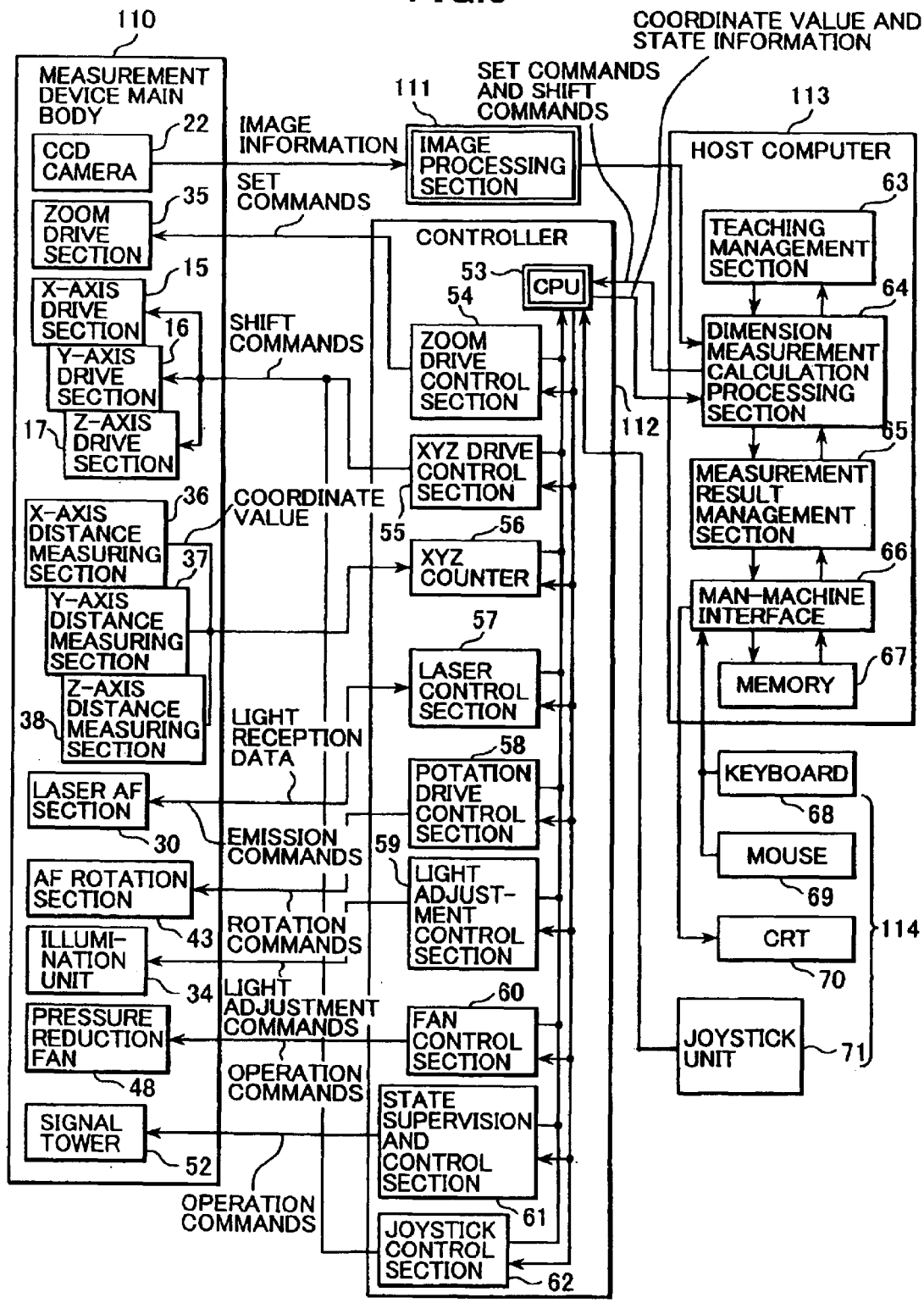
FIG. 3 shows a block diagram showing the overall structure of this carrier shape measurement device according to the first embodiment of the present invention.

The first embodiment of the carrier shape measurement device according to the present invention, as shown in FIG. 3, comprises a measurement device main body 110, an image processing section 111, a controller 112, a host computer 113, and an input and output section 114. First, the measurement device main body 110 will be explained. As shown in FIGS. 1, 2, 3, and 4, this measurement device main body 110 comprises a stage 12 upon which is loaded a carrier 18 which is to be the subject of measurement, and a measurement head 10. In this first embodiment, the stage 12 is fixed with respect to a pedestal 21, and the measurement head 10 is made so as to measure the shape of the carrier 18 as it is shifted by X-, Y-, and Z-axis shift sections 15, 16, and 17 in three dimensions with respect to the carrier 18. Thus, a chassis 11 which holds the measurement head 10 is loaded upon the pedestal 21, and the X-axis shift section 15 is arranged between the pedestal 21 and the chassis 11 for shifting the chassis 11 in the X-axis direction.

The X-axis shift section 15 comprises rails 15a which are formed upon the pedestal 21 and extend along the X-axis direction, sliding movement members 15b which are fixed to the under surface of the chassis 11 and are capable of sliding movement along the rails 15a, a motor 15c, a feed screw 15d which is connected to the rotation shaft of the motor 15c, and a nut 15e which is fixed to the under surface of the chassis 11 and is engaged upon the feed screw 15d. When the rotation shaft of the motor 15c rotates, the feed screw 15d rotates along with it, and thereby the nut 15e is shifted along the X-axis direction, so that the sliding movement members 15b slide along the rails 15a as well along the X-axis direction, and the chassis 11 to which the nut 15e and the sliding movement members 15b are fixed also are shifted along the X-axis direction.

The Y-axis shift section 16 is disposed within the chassis 11 between the measurement head 10 and a Z-axis movable plate 501. This Y-axis shift section 16 comprises rails 16a which are formed upon the front surface of the Z-axis movable plate 501 and which extend along the Y-axis direction, sliding movement members not shown in the figures which are formed upon the rear surface of the measurement head 10 and are capable of sliding movement along the rails 16a, a motor 16c, a feed screw 16d which is connected to the rotation shaft of the motor 16c, and a nut not shown in the figures which is fixed to the rear surface of the measurement head 10 and is engaged upon the feed screw 16d. When the rotation shaft of the motor 16c rotates, the feed screw 16d rotates along with it, and thereby the nut is shifted along the Y-axis direction, so that the sliding movement members also slide along the rails 16a along the Y-axis direction, and the measurement head 10 is also shifted along the Y-axis direction.

The Z-axis shift section 17 is provided within the chassis 11, and comprises rails 17a which are formed upon the front surface of a support post 502 and extend along the Z-axis direction, sliding movement members not shown in the figures which are formed upon the rear surface of the Z-axis movable plate 501 and are capable of sliding movement along the rails 17a, a motor 17c, a feed screw 17d which is connected to the rotation shaft of the motor 17c, and a nut not shown in the figures which is fixed to the rear surface of the Z-axis movable plate 501 and is engaged upon the feed screw 17d. When the rotation shaft of the motor 17c rotates, the feed screw 17d rotates along with it, and thereby the nut is shifted along the Z-axis direction, so that the sliding movement members also slide along the rails 17a along the Z-axis direction, and the Z-axis movable plate 501 is also shifted along the Z-axis direction. As a result, the measurement head 10 is shifted along the Z-axis direction.

The measurement head 10 can be shifted along the X-axis direction, the Y-axis direction, or the Z-axis direction by these structures. It should be noted that it would be possible for the construction to be such that any of the rails 15a, 16a, and 17a of the X-, Y-, and Z-axis shift sections 15, 16, and 17 were fixed by means of screws, so that, by loosening these screws, the axial directions of the rails may be adjusted. Furthermore, X-, Y-, and Z-axis distance measuring sections 36, 37, and 38 (see FIGS. 1, 2, and 3) are fitted to the X-, Y-, and Z-axis shift sections 15, 16, and 17, for measuring the actual amounts of movement along the X-, Y-, and Z-axes.

Moreover, a kinematic plate 20 is mounted upon the stage 12 for loading a carrier 18 of the so-called FOUP (Front Opening Unified Pod) type according to the SEMI standard. This kinematic plate 20 comprises three pins 20a, 20b, and 20c upon its upper surface. The forms and arrangement of these three pins 20a, 20b, and 20c are those specified by the SEMI standard (SEMI E57-1296).

A kinematic coupling that is a positioning mechanism for loading a carrier according to the SEMI standard is implemented by these three pins 20a, 20b, and 20c being engaged into a concave member shaped with V-grooves which is provided on the bottom surface of the aforesaid FOUP type carrier 18. By this construction, the FOUP type carrier 18 is supported on the stage 12 with its position being accurately determined. Accordingly, since with the shape measurement device of this first embodiment it is possible to perform measurement of the shape of the carrier 18 while supporting the carrier 18 by the same kinematic coupling arrangement as the carrier 18 would be supported by upon an actual semiconductor device production line, thereby it is possible to measure the shape and the attitude of the carrier 18 and the wafers which are loaded into it accurately in the same state as during actual use of the carrier 18.

Next, the structure of the measurement head 10 will be explained with reference to FIGS. 2 and 4. The measurement head 10 comprises two types of measurement section. First there is an imaging section 25 for measuring the shape according to an image which has been formed, and also there is a laser AF section 30 which measures the distance in the Y-axis direction using a laser.

The imaging section 25 comprises an objective lens 24, an optical system 23 which includes a zoom lens, and a CCD camera 22, all arranged in the specified order within a lens barrel 101 and along its optical axis 103. Although the zoom lens incorporated in the optical system 23 is not shown in FIGS. 2 and 4, it can be driven along the direction of the optical axis 103 by a zoom drive section 35 (refer to FIG. 3), whereby change of the zooming ratio is implemented. An optical fiber (not shown in the figures) which conducts illumination light emitted by an illumination unit 34 (refer to FIG. 3) which is arranged upon the pedestal 21 is taken into the lens barrel 101, and this illumination light which is emitted from the end of the optical fiber illuminates the subject of measurement via the objective lens 24.

Figure 4:
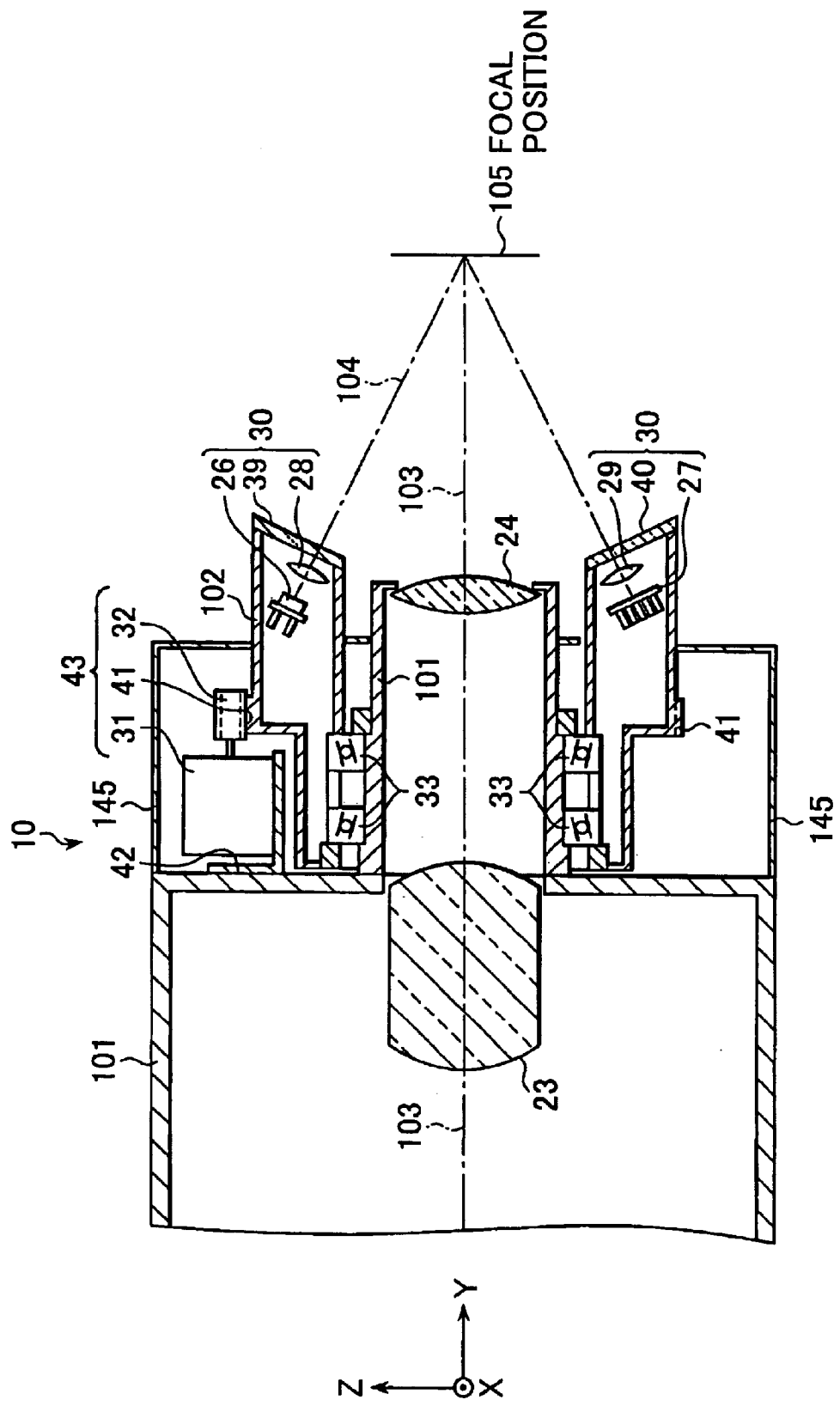
FIG. 4 shows a sectional view showing the structure of an end portion of a measurement head 10 of this carrier shape measurement device according to the first embodiment of the present invention.

Further, with regard to the diameter of the lens barrel 101, as shown in FIG. 4 its end portion in which the objective lens 24 is fitted is narrowed down, and a ring shaped lens barrel 102 is fitted around this end of the lens barrel 101. Bearings 33 are fitted between the lens barrel 101 and the ring shaped lens barrel 102, and thereby the ring shaped lens barrel 102 can rotate with respect to the lens barrel 101. Within the ring shaped lens barrel 102 there are provided a semiconductor laser 26, condenser lenses 28 and 29, and a light reception element 27, in the specified order along an optical path 104, all being incorporated in the laser AF section 30. As shown in FIG. 4, the semiconductor laser 26 and the condenser lens 28 are arranged on one side of the optical axis 103 of the imaging section 25, and the light reception element 27 and the condenser lens 29 are arranged in a symmetrical position thereto on the other side of said optical axis 103. Here, a CCD line sensor is utilized as the light reception element 27. Further, transparent windows 39 and 40 are provided in the ring shaped lens barrel 102 in positions in front of the semiconductor laser 26 and the light reception element 27 respectively, so that laser light which is emitted from the semiconductor laser 26 can pass through these transparent windows 39 and 40 to impinge upon the light reception element 27.

The imaging section 25 and the laser AF section 30 are made so that the focal point plane (focal point position) 105 of the imaging section 25 and the position at the center of the range of detection of the laser AF section 30 agree with one another. Accordingly, the optical axis 103 and the optical axis 104 intersect at this focal point plane 105.

A gear 41 is provided upon the outer periphery of the ring shaped lens barrel 102. Further, a motor 31 is fixed in the lens barrel 101 upon a fixing bracket 42, and a gear 32 is fitted upon the rotation shaft of this motor 31. This gear 32 is meshed with the above described gear 41, and thereby, when the motor 31 rotates, the ring shaped lens barrel 102 is thereby rotated around the lens barrel 101. These gears 41 and 32 and the motor 31 are included within the AF rotation section 43. Accordingly, by controlling the amount of rotation of the motor 31, the arrangement of the laser AF section 30 can be changed over between a vertical orientation shown in FIG. 5A in which the plane which contains its optical axis 104 is a vertical one, and a horizontal orientation shown in FIG. 5B in which said plane is a horizontal one. It should be understood that the base portions of the motor 31 and the ring shaped lens barrel 102 are covered over by a cover 145.

Moreover, although in this first embodiment the construction is such that the lens barrel 102 is rotated by the use of a gear, in an alternative possible structure, it would be acceptable to rotate the lens barrel 102 by fitting a belt between the rotation shaft of the motor 31 and the lens barrel 102.

Further, an aperture 13 of rectangular shape elongated along the Z-axis direction is provided to the chassis 11 (refer to FIG. 1) in the range within which the measurement head 10 is shifted by the Y-axis shift section 16. The width of this aperture 13 is of the same size as the width of the measurement head 10. The end portion of the measurement head 10 projects to the outside from the aperture 13. Furthermore, in order to prevent trash or dust generated within the chassis 11 from leaking to the outside from the aperture 13, a dustproof sheet 14 is arranged across the aperture 13 above and below the measurement head 10. This dustproof sheet 14 is a belt shaped sheet whose width is somewhat wider than the width of the aperture 13, and it is made from a material well endowed with pliability and which has a low surface coefficient of friction, and moreover whose frictional endurance is high. Both the ends of this belt shaped dustproof sheet 14 are fixed to the Z-axis movable plate 501 by a fixture 44 (refer to FIG. 2), and by this construction the dustproof sheet 14 is extended in a ring around the interior of the chassis 11, as shown in FIG. 2. It should be understood that the fixture 44 does not hamper movement of the measurement head 10 along the Y-axis direction, and moreover that the gap between the fixture 44 and the measurement head 10 is set to be of very minute width, in order to prevent the leakage of trash or dust through between the fixture 44 and the measurement head 10 to the outside.

Further, four rollers 45 are arranged at the corner portions of the chassis 11, as shown in FIG. 2, and the dustproof sheet 14 is guided by these rollers 45. Due to the dustproof sheet 14 being guided by these rollers 45, it is maintained in a shape so as to extend along the inner wall surface of the front surface portion of the chassis 11, and is tightly held against the aperture 13 and blocks it, while being extended along the inner wall surfaces of the upper and lower surface portions and the rear surface portion of the chassis 11 with a certain space being left between it and said inner wall surfaces. Further, a spring member 46 is arranged at an intermediate position along the ring shaped dustproof sheet 14. This spring member 46 stretches the dustproof sheet 14 along its lengthwise direction, thus preventing the occurrence of loosening thereof.

Since the dustproof sheet 14 is extended in a ring shape with both of its ends being fixed to the Z-axis movable plate 501 in this manner, when the measurement head 10 is shifted along the Z-axis direction by the operation of the Z-axis shift section 17, then the dustproof sheet 14 also shifts along with the shifting of the measurement head 10. At this time, by the ring shape of the dustproof sheet 14 being fed while being guided by the rollers 45, the portions of the aperture 13 above and below the measurement head 10 are always covered over by the dustproof sheet 14, and the leakage of trash or dust within the chassis 11 to the outside is always positively prevented. Further, since both the ends of the dustproof sheet 14 are fixed to the Z-axis movable plate 501 so as not to hamper the motion of the measurement head 10 in the Y-axis direction, therefore it is still possible for the measurement head 10 to be projected and withdrawn from the aperture 13 along the Y-axis direction.

Figure 7:
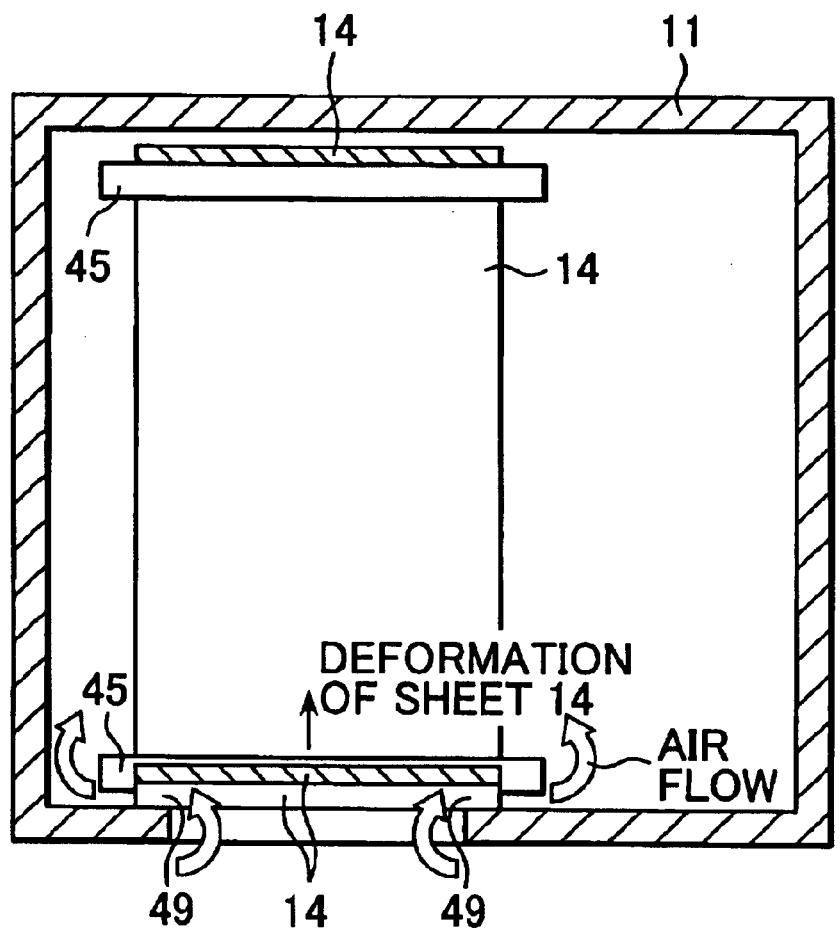
FIG. 7 shows a sectional view, taken looking along the arrows B–B' in FIG. 2, showing the situation when the pressure reduction fan 48 of this carrier shape measurement device according to the first embodiment of the present invention is operating.
Figure 8:
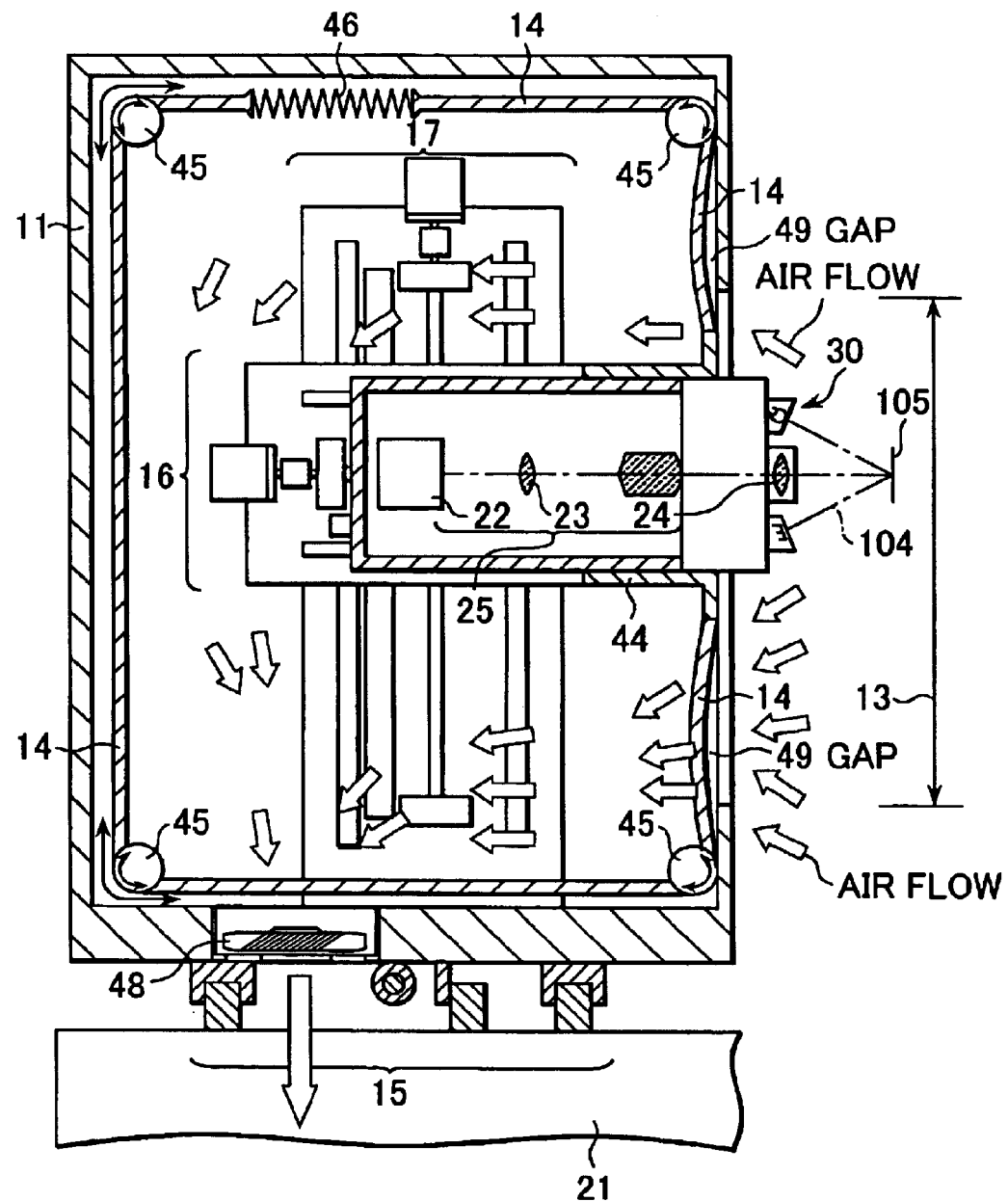
FIG. 8 shows a sectional view, taken looking along the arrows A–A' in FIG. 1, showing the situation when the pressure reduction fan 48 of this carrier shape measurement device according to the first embodiment of the present invention is operating.
Figure 9:
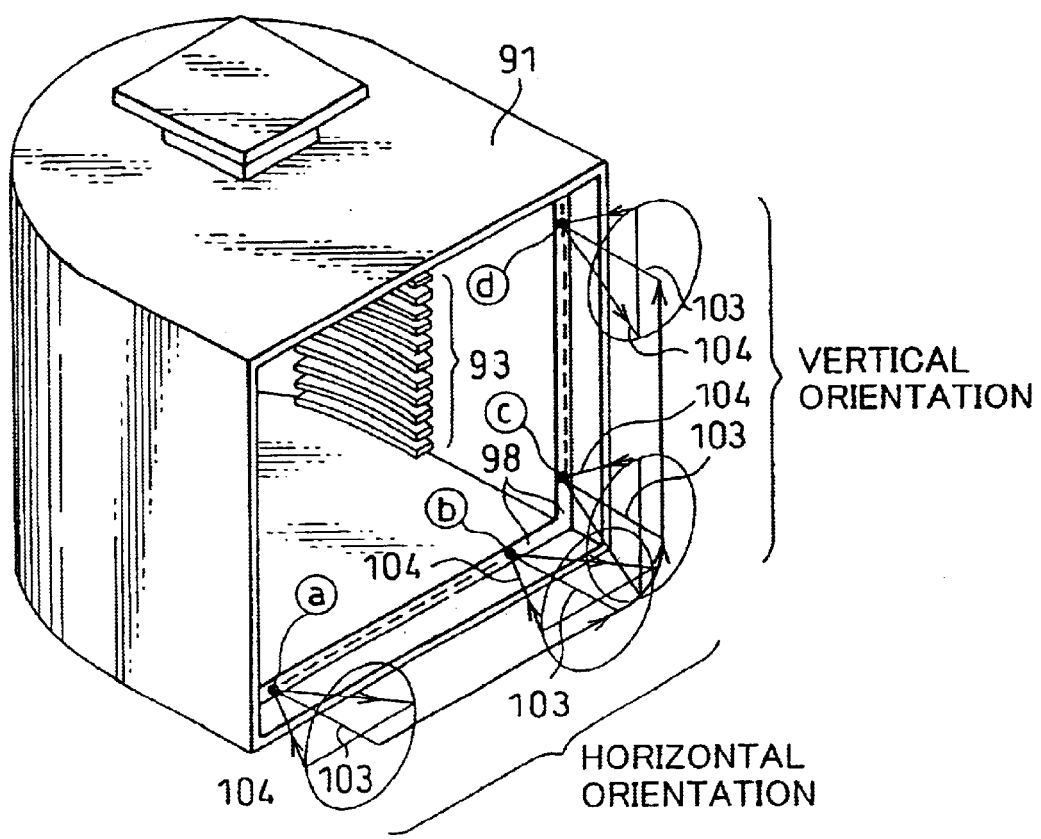
FIG. 9 shows an explanatory figure for explanation of the procedure for measurement of the degree of planarity of a surface 98 of a carrier 18 utilizing the carrier shape measurement device according to the first embodiment of the present invention.

An exhaust aperture 47 is opened through the lower portion of the chassis 11, and within it a pressure reduction fan 48 is disposed. This pressure reduction fan 48 is set to operate whenever the carrier shape measurement device according to this first preferred embodiment of the present invention is in the operational state. The inside of the chassis 11 achieves negative pressure by the operation of this pressure reduction fan 48. Due to this, the dustproof sheet 14 becomes somewhat bent as it is stretched toward the inner side at the aperture 13, and as shown in FIG. 8 a slight gap 49 is created between the chassis 11 and the dustproof sheet 14. Air flows in through this gap 49 from the outside into the interior of the chassis 11, as shown in FIGS. 7 and 8. Accordingly, it is possible yet more effectively to prevent the leakage of trash or dust which have been generated during operation by movable members inside the chassis 11, such as the X-, Y-, and Z-axis shift sections 15, 16, and 17 and the like, to the outside. Upon consideration of the sucking force of the pressure reduction fan 48, it should be noted that the magnitude of the reaction force by which the spring member 46 stretches the dustproof sheet 14 cannot prevent the generation of this gap 49, and in fact this reaction force is set so that no loosening in the dustproof sheet 14 away from its portions over the aperture 13 is caused.

Further, the outside of the chassis 11 is entirely covered over by a safety cover 50, except for its face which confronts the carrier 18 which is to be the subject of measurement. The size of the safety cover 50 is determined in consideration of the range of possible movement of the chassis 11 in the X-axis direction. Furthermore, the empty space in the upper portion of the stage 12 is covered over by a safety cover 51, except for its face which confronts the measurement head 10. The size of the safety cover 51 is determined in consideration of the size of the carrier 18 which is loaded. Further, the material from which the safety cover 51 is made is a material which has the optical characteristic of being non-transparent to the laser light which is emitted from the laser AF section 30 of the measurement section 10.

Further, to the upper portion of the safety cover 50 there is fitted a three color signal tower 52 for reporting the operational state of this carrier shape measurement device according to the first embodiment of the present invention.

Next, the image processing section 111, the controller 112, the host computer 113, and the input and output section 114 will be explained with reference to FIG. 3. The controller 112 comprises a CPU 53, a zoom drive control section 54, an XYZ drive control section 55, an XYZ counter 56, a laser control section 57, a rotation drive control section 58, a light adjustment control section 59, a fan control section 60, a state supervision and control section 61, and a joystick control section 62.

The zoom drive control section 54 outputs drive amount commands to the zoom drive section 35 of the measurement device main body 100 according to an imaging magnification ratio which it has received from a dimension measurement calculation processing section 64 of the host computer 113. By doing this, the amount of movement of the zoom lens of the optical system of the imaging section 25 is controlled, and thereby the imaging magnification ratio of the CCD camera 22 is controlled. Accordingly, it is possible to vary the imaging magnification ratio according to the size of the carrier 18 and the measurement accuracy which is to be required, and thereby it is possible to enhance the throughput.

The XYZ drive control section 55 receives shift commands from the dimension measurement calculation processing section 64 of the host computer 113, and commands the X-, Y-, and Z-axis shift sections 15, 16 and 17 of the measurement device main body 110 to be driven according thereto. Further, the XYZ counter 56 detects the coordinates to which the X-, Y-, and Z-axis shift sections 15, 16 and 17 have shifted, from the results of distance measurement which it receives from X-, Y-, and Z-axis distance measuring sections 36, 37 and 38 of the X-, Y-, and Z-axis shift sections 15, 16 and 17. The dimension measurement calculation processing section 64 of the host computer 113, along with shifting the measurement head 10 to the coordinates required for dimensional measurement by inputting these detected coordinates and controlling the amount of shifting by feedback, also performs minute adjustments in the Y-axis direction using the output results of the image processing section 111, and brings the focal point plane 105 of the measurement head 10 to coincide with the subject for measurement.

Figure 5A:
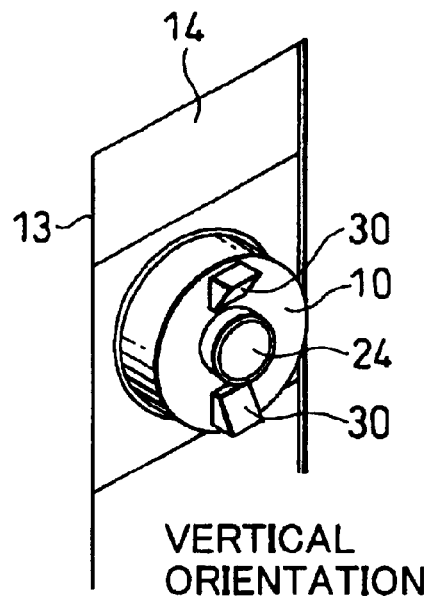
FIG. 5A shows a perspective view showing a laser AF section 30 of the measurement head 10 of the carrier shape measurement device according to the first embodiment of the present invention, in the case when it is oriented vertically.
Figure 5B:
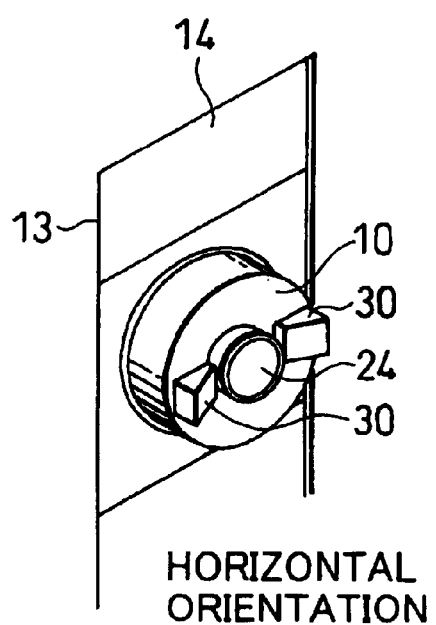
FIG. 5B shows it in the case when it is oriented horizontally.
Figure 6:
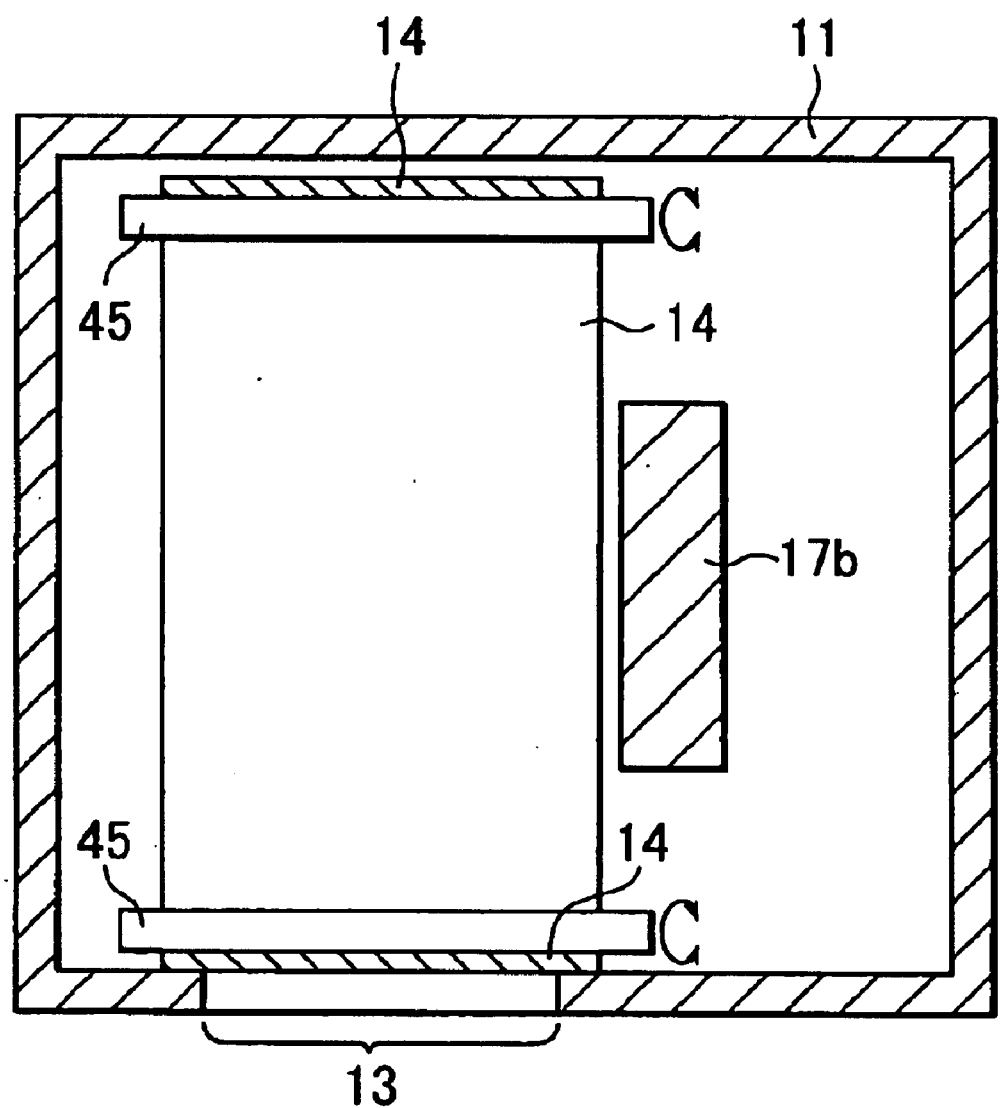
FIG. 6 shows a sectional view, taken looking along the arrows B–B' in FIG. 2, showing the situation when the pressure reduction fan 48 of this carrier shape measurement device according to the first embodiment of the present invention is not operating.

When the laser control section 57 has received a command from the host computer 113 for measurement using the laser AF section 30, along with outputting a command signal for light emission to the semiconductor laser 26 of the laser AF section 30, it also inputs a light reception signal from the light reception element 27 which comprises the CCD line sensor, and it derives the amount of deviation of the subject of measurement from the focal point plane 105 by detecting at which position upon the CCD line sensor the laser light is being received. Further, when the rotation drive control section 58 has received a command from the host computer 113 which indicates to which of its orientations—the vertical orientation as shown in FIG. 5A or the horizontal orientation as shown in FIG. 5B—the laser AF section 30 is to be changed, it outputs a signal to the motor 31 of the AF rotation section 43 which commands it to rotate by a predetermined rotation amount exactly. Due to this, it is possible to change over the orientation of the laser AF section 30 to the vertical orientation or to the horizontal orientation.

The light adjustment control section 59 receives adjustment commands for the amount of illumination light from the host computer 113 which the input and output section 114 has received from the operator, and outputs a signal which increases or decreases the amount of light which is emitted by the illumination unit 34, as appropriate. By doing this, the amount of illumination light which is incident upon the subject of measurement through the objective lens 24 of the imaging section 25 is adjusted, and the brightness of the image which is formed by the CCD camera 22 is varied. When the state supervision and control section 61 has received a signal which indicates that the host computer 113 is operating, it illuminates a green signal upon the signal tower 52; while, when the dimension measurement calculation processing section 64 of the host computer 113 is performing calculation for processing the results of distance measurement by the laser AF section 30, it illuminates a yellow signal upon the signal tower 52. Further, when the state supervision and control section 61 has received a signal which indicates that the host computer 113 is commanding the laser control section 57 to perform measurement using the laser AF section 30, it determines that light is being emitted by the semiconductor laser 26, and it flashes the yellow signal upon the signal tower 52. Moreover, when the state supervision and control section 61 has received an error signal which has been output by the host computer 113, it illuminates a red signal upon the signal tower 52.

Furthermore, when a joystick of a joystick unit 71 of the input and output section 71 is actuated by the operator, the joystick control section 62 commands the X-, Y-, and Z-axis shift sections 15, 16, and 17 to drive directly, and performs control of the measurement head 10 by shifting it in the X-, Y-, and Z-directions by exactly the amount by which the joystick is operated.

The CPU 53 of the controller 53 performs overall control of the operation of the various elements within the controlled 112 as described above.

On the other hand, the image processing section 111 receives imaging information which is output by the CCD camera 22, performs image processing thereupon such as binarization processing and the like, and outputs it to the host computer 113.

The host computer 113 comprises a teaching management section 63, a dimension measurement calculation processing section 64, a measurement result management section 65, a man-machine interface 66, and a memory 67. In the memory 67 there is stored in advance a program which is utilized for performing a plurality of measurements for measuring the dimensions of places upon a carrier 18 which is to be the subject of measurement, as desired by the operator. The teaching management section 63 receives commands designating the places which the operator desires to measure, or designating the desired method of measurement, from a keyboard 68 or a mouse 69 via the man-machine interface 66, and selects a program in the memory 67 for implementing these commands. And, along with commanding the execution of the aforesaid program to the dimension measurement calculation processing section 64, it checks upon the progress thereof.

By reading in from the memory the program which has been designated by the teaching management section 63 and executing it, the dimension measurement calculation processing section 64 issues commands as described above to the various sections of the controller 112, so as to shift the measurement head 10 to the desired coordinates and so as to perform measurement by the imaging section 25 and the laser AF section 30 of the measurement head 10. In concrete terms, the coordinates of each pixel of the output image are converted into XYZ coordinates by performing calculation to establish a correspondence between the output coordinates of the XYZ counter 56 (in the XYZ coordinate system of the X-, Y- and Z-axis shift sections 15, 16 and 17) which correspond to the coordinates of the central point of the image which is output from the image processing section 111, and processing is performed in order to derive the dimensions between the desired places in the output image of the image processing section 111. Further, the dimension measurement calculation processing section 64 performs calculation processing and the like in order to measure and detect the distribution of dimensions in the Y-axis direction (the depth direction) of the subject of measurement with high accuracy, by deriving the amount of deviation of the subject of measurement in the Y-axis direction from the focal point plane 105, using the laser AF section 30. It should be noted that the XYZ coordinates of the focal point plane 105 at the time of measurement by the laser AF section 30 correspond to the central point coordinates of the output image of the image processing section 111.

The dimension data for each place which have been calculated by the dimension management calculation processing section 64 are stored in a memory within the measurement result management section 65. This measurement result management section 65 either displays the dimension data within its memory just as they are upon a CRT 70, or, according to the command of the operator, performs calculation to derive statistical data or dimension deviation (error) data or the like for the dimension data, and displays the results of this calculation upon the CRT 70.

Figure 11:
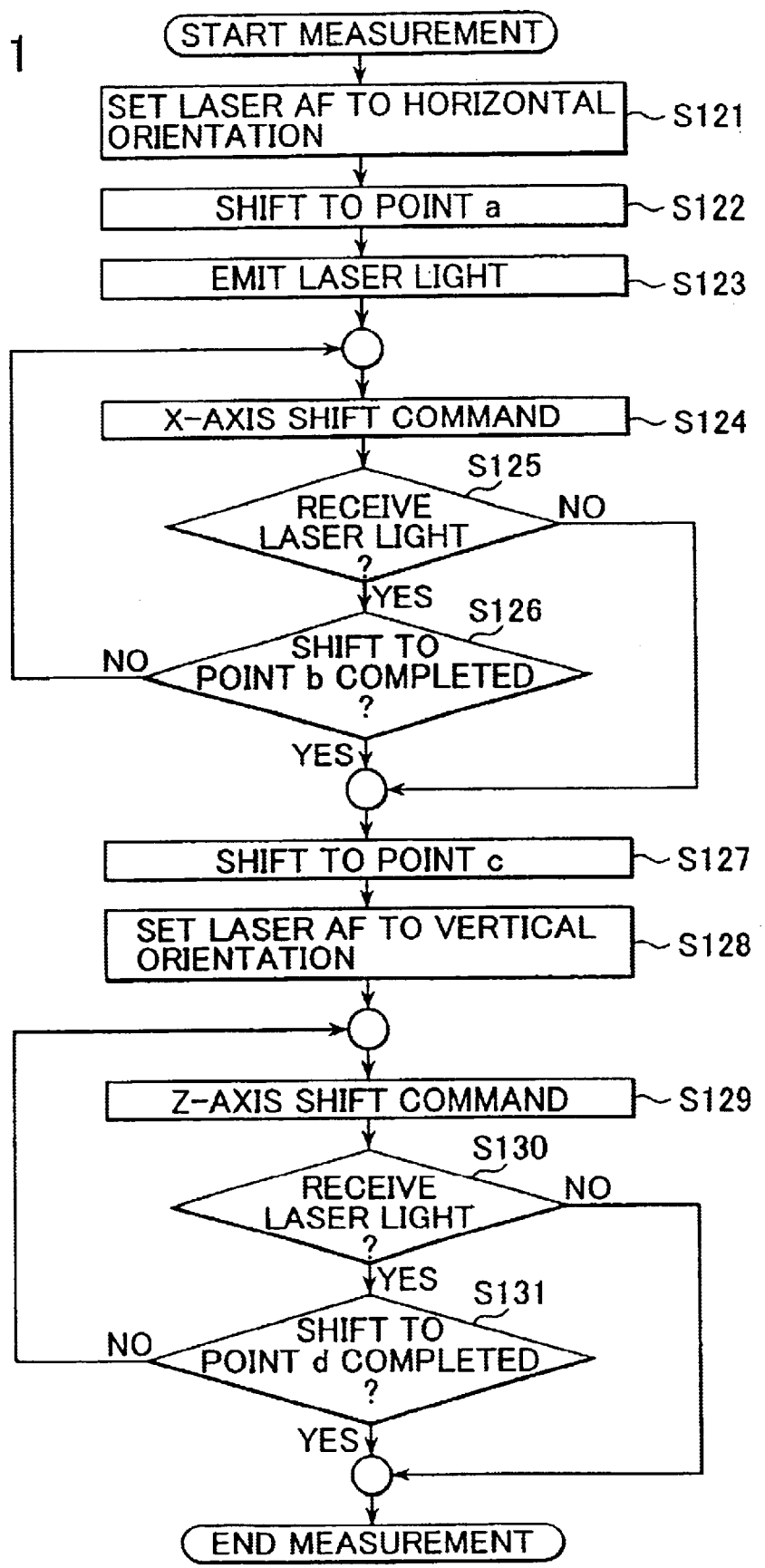
FIG. 11 shows a flow chart showing the operation for measuring the degree of planarity of the surface 98 of the carrier 18 utilizing the carrier shape measurement device according to the first embodiment of the present invention.

Now, the structure of a FOUP type carrier 18 which is the subject of measurement by this carrier shape measurement device according to the first embodiment of the present invention will be explained in detail. FOUP (Front Opening Unified Pod) is a carrier shape which is specified by the SEMI standard, and it is a carrier of the sealed type which receives wafers of 300 mm diameter. In concrete terms, the FOUP carrier 18 comprises a main body 91 which has an aperture only at its front surface, and a door 92 which is for closing this aperture. On both the side surfaces of the inside of the main body 91 there are provided a plurality of projections, i.e., of so-called teeth 93, with fixed spaces between them. Both the edges of wafers of 300 mm diameter are supported by these teeth 93 as shown in FIG. 11. Further, three concave members (not shown in the figures) are provided upon the bottom surface of the main body 91. A kinematic coupling according to the SEMI standard is implemented by these three concave members engaging with the pins 20*a*, 20*b* and 20*c* of the kinematic plate 20 of the stage 12.

Further, the door 92 of the FOUP type carrier 18 is provided with registration pin holes 96 for positioning the door 92, and with latch key holes 95 for keeping the door 92 in the unlocked state or in the locked state. When the door 92 is opened, first, positioning of the door 92 is performed by registration pins of a loading port being inserted into the registration pin holes 96, and then, after the door 92 has been put into the unlocked state by latch keys being inserted into the latch key holes and being rotated, the door 92 is separated from the main body 91 by the load port pulling the door 92 forward to itself.

It should be noted that the orientation of the kinematic plate 20 upon the stage 12 is arranged to be such that the aperture surface of the carrier 18 extends parallel to the XZ plane.

The carrier shape measurement device of this first embodiment is made so as to perform measurement by the measurement head 10 shifting in the X-, Y- and Z-directions as described above, and does not shift the carrier 18. Accordingly, since the carrier is not subjected to any vibration or shock or the like due to shifting, therefore it is possible to perform measurement with high accuracy in the state in which the semiconductor wafers 97 are loaded into the carrier 18. As for the places to be measured, although it is possible for the operator to measure places as desired, it is possible, for example, to obtain the width E of the interior of the opening in the carrier 18 by capturing with the imaging section 25 of the measurement head 10 an image which includes as places the points e, g and h shown in FIG. 11 and an image which includes the point f shown in FIG. 11; by the image processing section 111 detecting edge portions which correspond to the points e, f, g and h in these images; by the dimension measurement calculation processing section 64 calculating the coordinates of these points e, f, g and h; and by calculating the distance between the coordinates of the points e and f. Further, by calculating the distance between the points g and h, it is possible to obtain the width G of the edge of the aperture. It should be understood that, by performing the same measurements upon a plurality of places upon the carrier 18, it is possible to obtain the width E of the inside of the aperture and the width G of the edge of the aperture at a plurality of places. By doing this, it is possible to obtain the distributions of said widths E and said widths G. These measurements are performed upon the main body 91 of the carrier 18 in its state with the door 92 opened.

Further, in the same manner, as shown in FIG. 11, it is possible to measure the spaces I between the central portions of the front edges of the wafers 97 by forming with the imaging section 25 images including the points i, j, k, l, m and n at the central portions of the wafers 97, by the image processing section 111 detecting the edge portions which correspond to these points i, j, k, l, m and n in each of these images, and by the dimension measurement calculation processing section 64 calculating the coordinates of these points i, j, k, l, m and n, and deriving the spaces between the points i, j, k, l, m and n. At this time it is possible to measure the wafer spaces I at any positions such as at the edge portions of the wafer 97 or their central portions or the like, by using, for the X-coordinates of the points i, j, k, l, m and n, the X-coordinates of the desired positions upon the wafers 92 whose space I it is desired to obtain from the width E of the inner walls of the aperture which was previously derived.

Figure 10:
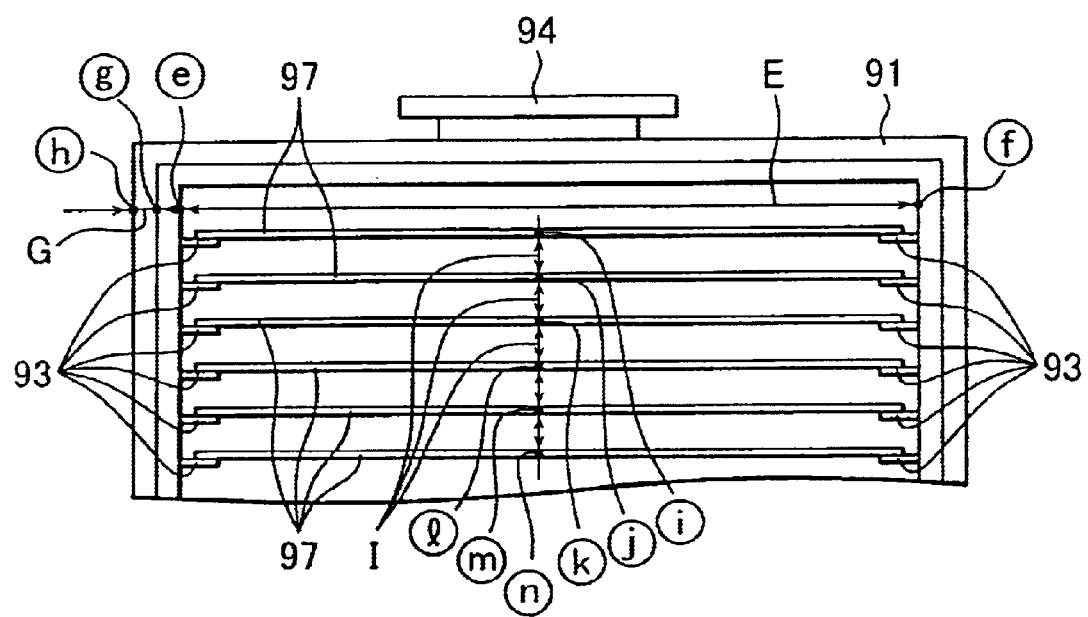
FIG. 10 shows an explanatory figure for explanation of an example of the situation and the measurement position when semiconductor wafers 97 are loaded into the carrier 18.
Figure 12A:
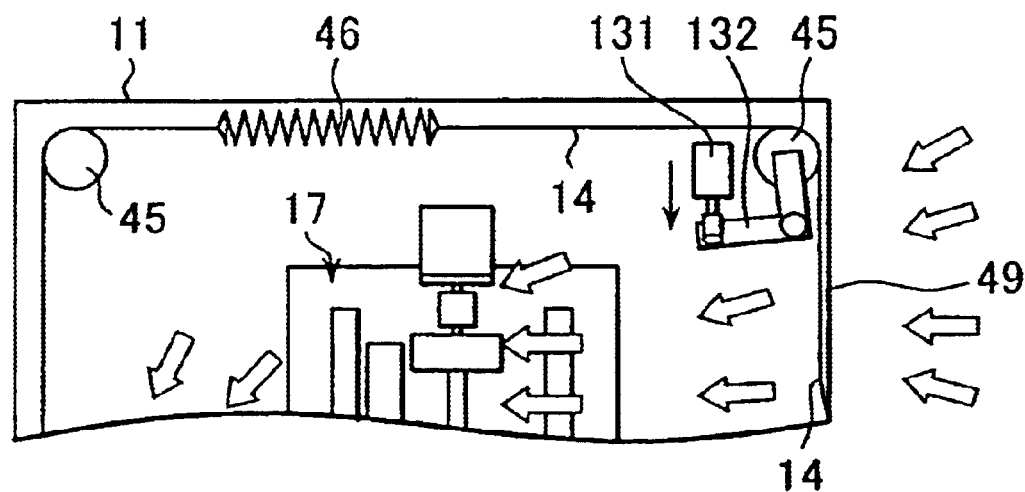
FIG. 12A shows, for the carrier shape measurement device according to the first embodiment of the present invention, an explanatory figure showing a structure in which a gap 49 can easily occur in a dustproof sheet 14.
Figure 12B:
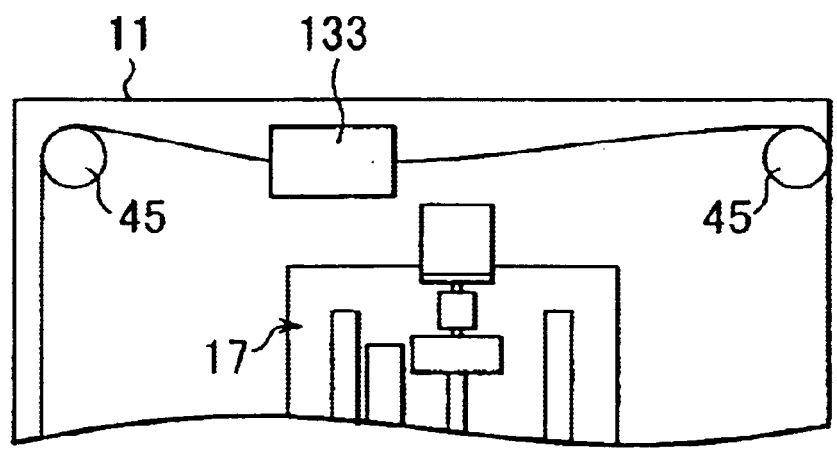
FIG. 12B shows another explanatory structure for preventing loosening of the dustproof sheet 14.

Further, in addition to forming an image by the imaging section 25 of the measurement head 10, it is possible to obtain the coordinates in the Y-axis direction with high accuracy by using the laser AF section 30. At this time, since as has been explained with reference to FIGS. 5A and 5B the direction of emission of laser light by the laser AF section 30 can be changed over between the vertical orientation and the horizontal orientation, therefore it is also possible to perform measurement with the laser AF section 30 for narrow portions where it is easy for the laser light to be eclipsed by a structure in which the subject of measurement projects forward. Herein, as an example of measurement using the laser AF section 30, the case of performing measurement operation for the degree of planarity (flatness) of the surface 98 at the edge of the aperture where the door hits and stops and will be described with reference to FIG. 10 and FIG. 12. The dimension measurement calculation section 64 reads in a program which is stored in the memory 67 the details of which are shown in the flow chart of FIG. 12, and performs measurement by executing this program. Although the coordinates of the points a, b, c and d in FIG. 10 are used in the flow chart of FIG. 12, they correspond to coordinates which the dimension measurement calculation processing section 64 had measured, before the above measurements, by forming an image by the imaging section 25, or coordinates which have been designated by the operator via the input and output section 114.

First, in a step S121, the orientation of the laser AF section 30 is set to the horizontal orientation shown in FIG. 5B by the dimension measurement calculation processing section 64 outputting commands to the rotation drive control section 58 for rotation of the AF rotation section 43 of the laser AF section 30. Next, in a step S122, the dimension measurement calculation processing section 64, along with commanding the XYZ drive control section 55 to perform shifting, also receives the results of detection from the XYZ counter 56 so as to perform feedback processing for the amount of shifting, and thereby shifts the focal point plane 105 of the measurement head 10 to the point a upon the hitting surface 98. Next, in a step S123, the dimension measurement calculation processing section 64 commands the laser control section 57 to emit light from the semiconductor laser 26, and in this state while commanding (in a step S124) the XYZ drive control section 55 to shift the measurement head 10 in the X-axis direction at a speed which is determined in advance, it receives from the laser control section 57 (in a step S125) the amount of deviation of the subject of measurement from the focal point plane 105 in the Y-axis direction. The dimension measurement calculation processing section 64 accurately calculates the Y-axis coordinate from the amount of deviation in the Y-axis direction which it has received from the laser control section 57. Further, as for the X- and Z-coordinates at each point, the detection signals from the XYZ axis distance measuring devices 36, 37 and 38 are read in by the XYZ counter 56 and these coordinates are determined therefrom. These steps S124 and S125 are repeated until it is determined in a step S126 that the coordinates of the measurement head 10 have reached the point b. However, if during this process it has become apparent from the output of the laser control section 57 that light reception by the light reception element 27 in the step S125 has become impossible, then it is determined that the laser light has eclipsed by the edge of the aperture, and the flow of control is transferred to a step S127.

In the step S127 the dimension measurement calculation processing section 64 shifts the measurement head 10 to the coordinates of the point c, in order to measure the accuracy of planarity of the hitting face 98 in the vertical direction. When performing this shifting, in the same manner as in the step S122, along with commanding the XYZ drive control section 55 to perform shifting, feedback processing is performed by receiving the results of detection from the XYZ counter 56. Next, by the dimension measurement calculation processing section 64 outputting commands to the rotation drive control section 58 so as to rotate the AF rotation section 43 of the laser AF section 30, the orientation of the laser AF section 30 is set (in a step S128) to the vertical orientation as shown in FIG. 5A. And while commanding (in a step S129) the XYZ drive control section 55 to shift the measurement head 10 in the Z-axis direction at a speed which is determined in advance, it receives from the laser control section 57 (in a step S130) the amount of deviation of the subject of measurement from the focal point plane 105 in the Y-axis direction. The dimension measurement calculation processing section 64 accurately calculates the Y-axis coordinate from the amount of deviation in the Y-axis direction which it has received from the laser control section 57. Further, as for the X- and Z-coordinates at each point, the detection signals from the XYZ axis distance measuring devices 36, 37 and 38 are read in by the XYZ counter 56 and these coordinates are determined therefrom. These steps S129 and S130 are repeated until it is determined in a step S131 that the coordinates of the measurement head 10 have reached the point d, and then measurement is terminated. However, if during this process it has become apparent from the output of the laser control section 57 that light reception by the light reception element 27 in the step S130 has become impossible, then it is determined that the laser light is eclipsed by the edge of the aperture, and measurement is terminated.

The dimension measurement calculation processing section 64 derives the degree of planarity from the Y-coordinates of the various points upon the hitting surface 98 which have been obtained by this measurement process, and, along with storing the results thereof in the measurement result management section 65, also displays them upon the CRT 70.

In this manner, since in this first embodiment of the present invention the measurement head 10 is provided with the laser AF section 30, it is possible to measure the coordinates in the Y-axis direction with high accuracy. Accordingly, it is possible to measure the degree of planarity of the carrier 18 with high accuracy. Furthermore, since with the measurement of the above described hitting surface 98 it is possible to change over the orientation of the laser AF section 30 between the vertical orientation and the horizontal orientation while performing the measurement, therefore it becomes possible to perform measurement while following along the peripheral direction of a hitting surface 98 which could not be measured with the laser AF section 30 remaining in either one of the vertical orientation and the horizontal orientation alone, due to the laser light being eclipsed by the edge.

Further, although the above explanation has been made in terms of measurement being performed upon the main body 91 of the carrier 18 in its state with the door 92 open, the shape measurement device of the present invention is not to be considered as being limited to only measuring the main body 91; it can also measure the shape of a carrier 18 with the door 92 closed. For example, it can measure the shapes and arrangement of the registration holes 96 or the latch key holes 95 of the door 92, or the outer shape of the door 92.

Since, as described above, the shape measurement device of this embodiment of the present invention is structured so that measurement is performed by shifting the measurement head 10 in three dimensions, rather than by shifting the carrier 18, therefore the carrier 18 is not subjected to vibration or to shock. Due to this, it is possible to perform measurement upon the carrier 18 with the semiconductor wafers 97 loaded into it just as they are, and it is also possible directly to measure the spaces between the wafers 97 and their inclinations and the like in any desired positions. Accordingly, it is possible directly to perform assessment of the carrier 18 from the data showing the attitudes of the wafers 97 within it.

Further, since the carrier 18 is not subjected to vibration or shock, there is no risk of shifting of the attitude of the carrier 18, or of shifting of the wafers 97 which are loaded into the carrier 18. Accordingly, it is possible to guarantee the reliability of measurement accuracy.

Further, since it is possible directly to measure the spaces between the wafers 97 and their inclinations, it becomes possible greatly to enhance the accuracy of measurement, as compared to the case in which these parameters are inferred from the shapes of the teeth 93 of the carrier 18.

Further, since in the shape measurement device according to this embodiment of the present invention the imaging section 25 is structured so as to form an image by emitting illumination light from the objective lens 24 and by refocusing the reflected light through the objective lens 24 again, also the laser AF section is structured so as to emit laser light and receive the reflected laser light, therefore it is not necessary to employ the transmitted illumination method, and it becomes possible to measure with good accuracy the shape of a carrier such as a FOUP type carrier 18 of which the rear surface is closed.

Further, with the shape measurement device according to this embodiment of the present invention, it is possible greatly to enhance the accuracy of measurement in the Y-axis direction by using the laser AF section 30, as compared to the case in which the Y-axis coordinate was derived from the focusing position of an imaging device. Further, since the laser AF section 30 is made so that the direction of the light which it emits can be changed over between the vertical orientation and the horizontal orientation, thereby it is possible to perform measurement of the shape in the depth direction with high accuracy using the laser AF section 30, even for constricted portions where the laser beam is eclipsed.

Further, with the shape measurement device according to this embodiment of the present invention, the structure is such that the aperture 13 in the chassis 11 is blocked by the dustproof sheet 14 without impeding the movability of the measurement head 10 in any way. By this dustproof sheet 14 pressing closely against the aperture 13 !! when the device is not operating, the escape of trash or dust within the chassis 11 from the chassis to the outside is positively prevented. Further, during the operation of the device the dustproof sheet 14 is deformed by the operation of the pressure reduction fan 48 so that the minute gap 49 is formed, and, since thereby a flow of air from the outside of the chassis 11 to its inside is set up, thereby the escape of trash or dust generated by moving parts or the like within the chassis 11 to the outside is even more positively prevented.

Further, although with the shape measurement device according to this embodiment of the present invention a portion of the drive mechanism for shifting the measurement head 10 in three dimensions is arranged at a higher position than that of the carrier 18, due to the above described dustproofing effect, it is possible positively to prevent trash or dust which may be generated by the drive mechanism from adhering to the carrier 18 or to the wafers 97. Furthermore, since as explained above the carrier 18 is not shifted, there is no danger of the wafers flying out from the carrier 18 during the measurement process, or of them being damaged. Since in this manner the measurement device according to this embodiment of the present invention does not contaminate the carrier 18 or the wafers 97, and since moreover there is no danger of it damaging them, accordingly it is possible to arrange it midway upon a semiconductor device production line, so that its applicability is very general.

Further, although with the shape measurement device according to the above described embodiment of the present invention the gap 49 was created by the deformation of the dustproof sheet 14 only when the pressure reduction fan 48 was operating, it is also possible, as shown in FIG. 13A, for the structure to be such that the two rollers 45 above and below the aperture 13 are slanted inwards so as to aid with the creation of the gap 49. As a possible structure for slanting the rollers 45 inwards, it is possible to fix right angled members 132 to the rollers as shown in FIG. 13A, and to press these members 132 downwards by drive sources 131 such as rotary solenoids or air cylinders or the like.

Yet further, instead of the spring member 46 for preventing loosening of the dustproof sheet 14, it would also be possible to provide a weight 133, as shown in FIG. 13B. Yet further, although in the above described embodiment the dustproof sheet 14 was formed into a ring shape which was wrapped around the inside of the chassis 11, it would also be possible to provide rollers 45 above and below the aperture 13, and for this dustproof sheet 14 to be wound up upon these rollers 45 with a certain force.

What is claimed is:

1. A shape measurement device, comprising:
   a loading section for loading a subject for measurement;
   an imaging section that forms an image of the subject for measurement; and
   a shifting section that implements relative shifting between said imaging section and the subject for measurement to shift said imaging section to a position corresponding to a portion on the subject for measurement which is to be measured, wherein:
   an optical axis of said imaging section is substantially parallel to a loading plane of said loading section; and
   said shifting section implements said relative shifting by shifting said imaging section in a direction substantially perpendicular to the loading plane of said loading section.

2. A shape measurement device, comprising:
   a stage for loading a subject for measurement;
   a measurement section that measures a shape of the subject for measurement;
   a shifting section that implements relative shifting between said imaging section and the subject for measurement to shift said imaging section to a position corresponding to a portion on the subject for measurement which is to be measured; and
   a chassis that houses at least a part of said measurement section and said shifting section, wherein:
   said chassis is formed, at a region thereof which faces the subject for measurement, with an aperture which does not hinder said shifting of said measurement section;
   an end of said measurement section protrudes from said aperture towards the subject for measurement; and
   a dustproof member is disposed at said aperture in order to prevent dust within said chassis from leaking out towards the subject for measurement while not hindering said shifting of said measurement section, said dustproof member covering said aperture except for a portion corresponding to said measurement section.

3. A shape measurement device according to claim 2, further comprising:
   a negative pressure device that decompresses an interior of said chassis in order to distort said dustproof member and create an air current which enters into said chassis through a gap between said distorted dustproof member and said aperture.

4. A shape measurement device, comprising:
   a stage for loading a subject for measurement;
   a measurement section that measures a shape of the subject for measurement; and
   a shifting section that implements relative shifting between said measurement section and the subject for measurement to shift said measurement section to a position corresponding to a portion on the subject for measurement which is to be measured, wherein said measurement section comprises an illumination section which illuminates laser light upon the subject for measurement from a slanting direction, a light reception section which receives said laser light which has been reflected from the subject for measurement, and a rotation drive section which rotates said illumination section and said light reception section while preserving a mutual positional relationship of said illumination section and said light reception section, without changing a region upon said subject for measurement which is illuminated by said laser light.

5. A shape measurement device according to claim 4, wherein said measurement section comprises an imaging section for forming an image of the subject for measurement, and detects a distance from the subject for measurement along a direction of an optical axis of said imaging section based upon an output from said light reception section.

6. A shape measurement device according to claim 1, wherein said shifting section implements said relative shifting by further shifting said imaging section in a direction substantially parallel to the loading plane of said loading section.

* * * * *